United States Patent [19]
Park

[11] Patent Number: 5,930,649
[45] Date of Patent: *Jul. 27, 1999

[54] METHOD OF FORMING DEVICE ISOLATING LAYER OF SEMICONDUCTOR DEVICE

[75] Inventor: Joo-seog Park, Chungcheongbuk-do, Rep. of Korea

[73] Assignee: LG Semicon Co., Ltd., Cheongju, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/824,410

[22] Filed: Mar. 26, 1997

[30] Foreign Application Priority Data

Jul. 22, 1996 [KR] Rep. of Korea ................. 96-29531

[51] Int. Cl.$^6$ .................................................. H01L 21/76
[52] U.S. Cl. ......................... 438/444; 438/439; 438/443; 438/297
[58] Field of Search .................................. 438/439, 443, 438/444, 297, 298

[56] References Cited

U.S. PATENT DOCUMENTS

| | | | |
|---|---|---|---|
| 4,272,308 | 6/1981 | Varshney | 148/187 |
| 4,292,156 | 9/1981 | Matsumoto et al. | 204/192 EC |
| 4,580,330 | 4/1986 | Pollack et al. | 148/DIG. 50 |
| 5,134,089 | 7/1992 | Barden et al. | 438/443 |
| 5,369,051 | 11/1994 | Rao et al. | 438/449 |
| 5,422,300 | 6/1995 | Pfiester et al. | . |
| 5,470,783 | 11/1995 | Chiu et al. | 148/DIG. 50 |
| 5,538,917 | 7/1996 | Kunitou | 438/443 |
| 5,679,601 | 10/1997 | Wu | . |

*Primary Examiner*—Trung Dang
*Attorney, Agent, or Firm*—Fleshner & Kim

[57] ABSTRACT

A method of forming a device isolation layer of a semiconductor device includes the steps of forming a first buffer layer on the active region of a semiconductor substrate and forming an oxidation preventive layer on the first buffer layer. A second buffer layer is formed on the semiconductor substrate, and an oxidation preventive side wall is formed on the side parts of the first buffer layer and the oxidation preventive layer. A recess or a trench is formed next to the sidewall, and a device isolation layer is formed in the recess or the trench by oxidation.

9 Claims, 3 Drawing Sheets

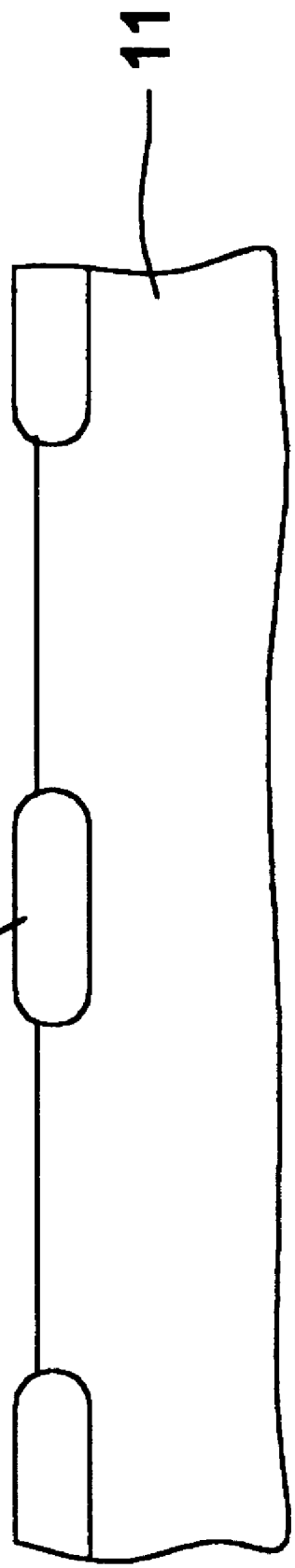

METHOD OF FORMING DEVICE ISOLATING LAYER OF SEMICONDUCTOR DEVICE

BACKGROUND OF THE INVENTION

1. Field of the Invention

The present invention relates to a method of forming a device isolation layer of a semiconductor device, and more particularly, to a method of forming a device isolation layer of a semiconductor device with a recessed device isolation layer.

2. Background of the Related Art

In a semiconductor device, the isolation layer of unit elements greatly affects the operation of the unit elements and the packing density of an integrated circuit. A thick oxide layer is formed as a device isolation layer for isolating the unit elements of a semiconductor integrated circuit by a selective oxidation, such as LOCOS (Local Oxidation of Silicon).

However, a bird's beak may be formed during the formation of the device isolation layer such that the size of an active region, where the device is to be formed, is reduced, and thus, there is difficulty in achieving a high-density integration of semiconductor elements. For this reason, other methods of forming a device isolation layer have been suggested so as to reduce the bird's beak or to prevent the formation of the bird's beak.

U.S. Pat. No. 4,272,308 discloses a method of forming a device isolation layer with reduced bird's beak. In the method, a buffer oxide layer and a first nitride layer are formed on a silicon substrate. An active region is defined by exposing a predetermined part of the silicon substrate through a photolithographic method. After depositing a second nitride layer on the whole surface of the above structure, the second nitride layer is removed by means of a reactive ion etching (RIE), other than its regions which are deposited on the upper part and the side parts of the first nitride layer so as to expose the silicon substrate. A device isolation layer is formed on such exposed silicon substrate by a thermal oxidation process.

However, the silicon substrate comes into contact with the second nitride layer, which is used as the side wall in the above-described method, such that there is a deterioration of the electrical characteristics of the device, caused by stress during the thermal oxidation. Additionally, a large step height between the upper part of the device isolation layer and the active region of the silicon substrate is disadvantageous.

U.S. Pat. No. 4,292,156 discloses another method of forming a device isolation layer. In this method, an oxide layer is formed on a silicon substrate, and then an active region is defined by removing the oxide layer to a predetermined width of the silicon substrate by a photolithographic process. After forming a side wall of silicon nitride on the exposed side parts of the oxide layer and the silicon substrate, a device isolation layer is formed on the exposed silicon substrate by thermal oxidation.

The above method is disadvantageous, because the silicon substrate within the active region, which is covered with the oxide layer, is subject to oxidation during the thermal oxidation to form the device isolation layer. Further, the silicon substrate is in contact with the side parts and bottom of the nitride layer, resulting in the deterioration of the electrical characteristics in the device, caused by the distortion at the edge of the device isolation layer and the stress on the substrate during the thermal oxidation. Moreover, the threshold voltage of the device is changed.

The above references are incorporated by reference herein where appropriate for appropriate teachings of additional or alternative details, features and/or technical background.

SUMMARY OF THE INVENTION

An object of the present invention is to substantially obviate one or more of the problems and disadvantages of the related art.

Another object of the present invention is to decrease the stress on the substrate caused during a thermal oxidation process.

Another object of the present invention is to reduce the step height difference between the upper part of the device isolation layer and the active region of a silicon substrate.

Still another object of thee present invention is to prevent the silicon substrate within the active region from being oxidated during a thermal oxidation process.

A further object of the present invention is to prevent the change of the threshold voltage of the device.

Another object of the present invention is to prevent the distortion at the edge of the device isolation layer.

To achieve these and other advantages and in accordance with the objects of the present invention, as embodied and broadly described, the method of forming a device isolation layer of a semiconductor device includes the steps of forming a first buffer layer on a semiconductor substrate and an oxidation preventive layer on the first buffer layer, forming a second buffer layer on both sides of said first buffer layer, and forming an oxidation preventive side wall on the sides of the first buffer layer and said oxidation preventive layer, and forming the device isolation layer on the semiconductor substrate.

The present invention may be achieved in whole or in part by at least a method of forming an isolation layer on a substrate, comprising the steps of (a) covering a prescribed portion of a surface of the substrate with a first layer; (b) forming a sidewall on the first layer; (c) forming a recess, adjacent to the sidewall, in the substrate; and (d) forming the isolation layer in the trench, wherein step (b) is performed prior to step (c).

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 1–5 are process diagrams illustrating a method of forming a device isolation layer of a semiconductor device in accordance with the present invention.

DETAILED DESCRIPTION OF PREFERRED EMBODIMENTS

Figure 1:
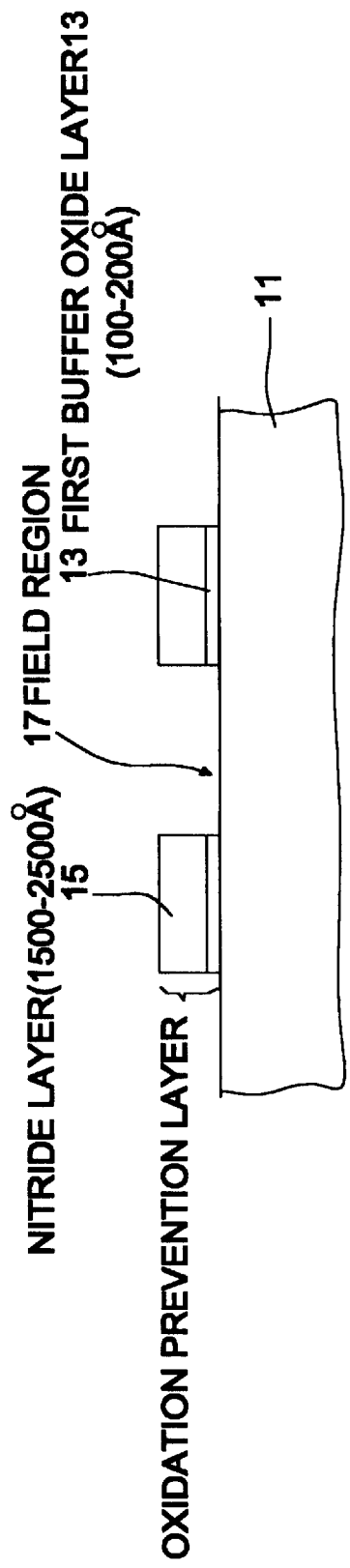

With reference to FIG. 1, a first buffer oxide layer 13 of about 100–200 Å and a nitride layer 15 of about 1500–2500 Å (an oxidation preventive layer) are sequentially formed on the surface of a semiconductor substrate 11. The first buffer oxide layer 13 is formed by thermal oxidation or chemical vapor deposition (CVD), and the nitride layer 15 is formed by chemical vapor deposition. Thereafter, a predetermined field region 17 of the silicon substrate 11 is exposed by means of a photolithographic process.

Figure 2:
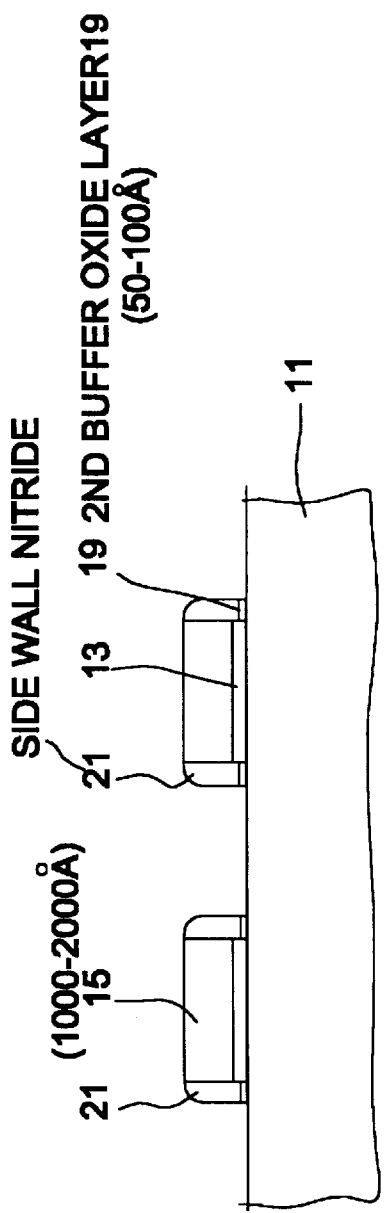

A second buffer oxide layer 19 of about 50~100 Å is formed by thermal oxidation on the surface of the field region 17, where the silicon substrate 11 is exposed. Successively, a nitride layer of about 100~600 Å is deposited through chemical vapor deposition on the surface of the nitride layer 15 and the second buffer oxide layer 19. The deposited nitride layer 15 is etched to a thickness of about 1000~2000 Å, and a reactive-ion etching process is performed to form a side wall 21. Then, the second buffer oxide layer 19, where the side wall 21 is not formed, is removed so as to expose the field region 17 of the silicon substrate 11. See FIG. 2.

Figure 3:
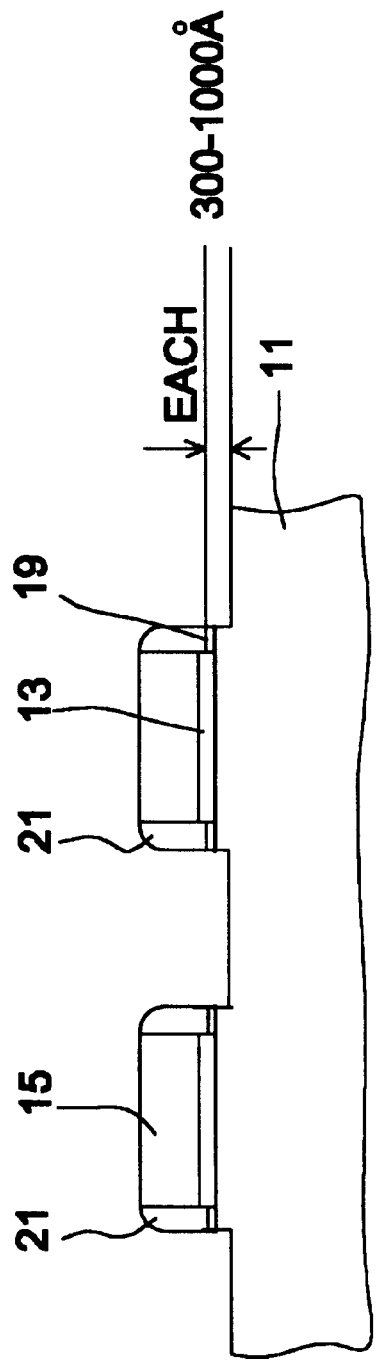

With reference to FIG. 3, the field region 17 of the silicon substrate 11 is anisotropically etched to a depth of about 300~1000 Å, using the nitride layer 15 and the side wall 21 as an etching mask, to form a recess or a trench.

Figure 4:
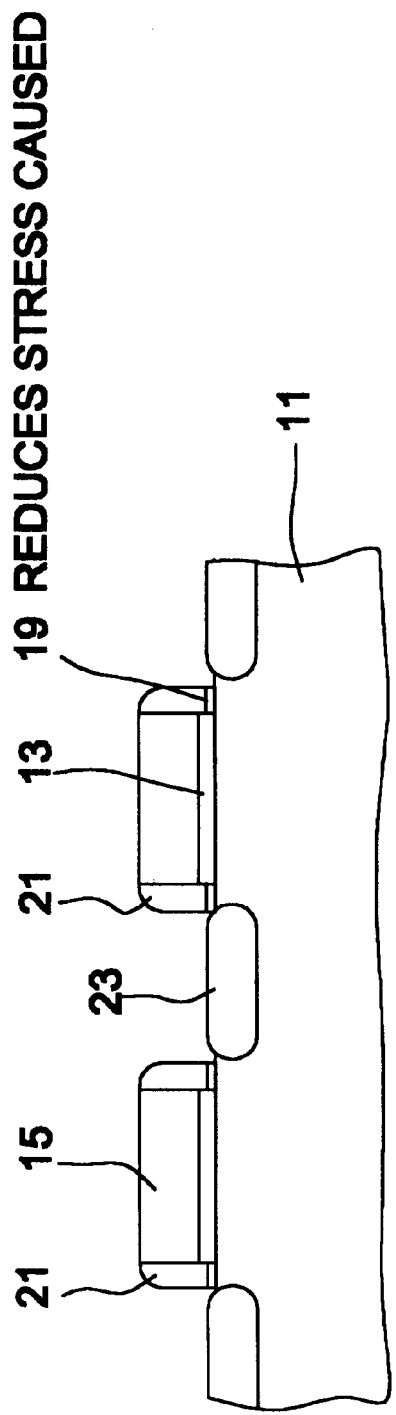

Referring to FIG. 4, the exposed field region 17 of the silicon substrate 11 is oxidated so as to form a device isolation layer 23 of about 3000~5000 Å. During this process, the second buffer oxide layer 19 reduces the stress which is caused by the different thermal expansion coefficients of the silicon substrate 11 and the side wall 21. The device isolation layer 23 is treated by a wet etching process to a thickness of about 200~500 Å, and the edge part of the device isolation layer 23 is prevented from being projected. In such a process, a part of the silicon substrate 11, where the field oxidation is to be formed, is previously etched and the surface of the device isolation layer 23 is treated by a wet etching process, which facilitates the planarization of the surfaces of the device isolation layer 23 and the active region of the silicon substrate 11.

Referring to FIG. 5, the silicon substrate 11 of the active region is exposed by removing the nitride layer 15, the side wall 21, and the first and second buffer oxide layers 13 and 19.

As described above in the present invention, the second buffer oxide layer is deposited on the exposed field region of the silicon substrate, and the side wall is formed on the side parts of the first buffer oxide layer and the nitride layer. After anisotrophically etching the field region of the silicon substrate while using the nitride layer and the side wall as an etching mask, the exposed field region of the silicon substrate is oxidated so as to form a device isolation layer.

The method of forming a device isolation layer according to the present invention possesses various advantages over the related art. For example, the stress is reduced by isolating the silicon substrate from the side wall of the nitride film during the thermal oxidation step. Further, the step height difference between the two surfaces of the device isolation layer and the silicon substrate for the active region is reduced. Additionally, the present invention can prevent the oxidation of the silicon substrate within the active region during the thermal oxidation and can prevent the change of the threshold voltage of the element, due to the distortion at the edge of the device isolation layer.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming a device isolation layer of a semiconductor device, comprising the steps of:

forming a first oxide layer on a semiconductor substrate and a first nitride layer on said first oxide layer;

patterning said first oxide layer and said first nitride layer to expose a predetermined field region;

forming a second oxide layer on said field region such that a thickness of said second oxide layer is lower than that of said first oxide layer;

forming, prior to forming a trench in said substrate, a sidewall on said second oxide layer at both sides of said first oxide layer and said first nitride layer;

forming a trench in said substrate using said first nitride layer and said sidewall as a mask;

forming said device isolation layer in said trench; and removing said first nitride layer, said sidewall, said first and second oxide layer.

2. The method of claim 1, wherein the step of forming said sidewall comprises the steps of:

depositing a second nitride layer on said first nitride layer and said second oxide layer; and etching said second nitride layer until said substrate is exposed to form said sidewall.

3. The method of claim 1, wherein the depth of said trench is about 300~1000 Å.

4. The method of claim 1, further comprising the steps of wet-etching said device isolation layer to a thickness of about 200~500 Å after said removing step.

5. The method of claim 1, wherein the first oxide layer has a thickness of about 100 Å to 200 Å and the first nitride layer has a thickness of about 1500 Å to 2500 Å.

6. The method of claim 5, wherein the first nitride layer is etched to have a thickness of about 1000 Å to 2000 Å after the sidewall forming step.

7. The method of claim 1, wherein said second oxide layer is formed at both sides of first oxide layer and on a portion of said substrate.

8. The method of claim 1, wherein the steps of forming the trench comprises the step of etching a portion of said second oxide layer and said substrate simultaneously using said first nitride layer and said sidewall as a mask.

9. The method of claim 1, wherein the second oxide layer has a thickness of about 50 Å to 100 Å.

* * * * *